United States Patent [19]

Sauer

[11] 4,362,999

[45] Dec. 7, 1982

[54] AM STEREO PHASE MODULATION DECODER

[75] Inventor: Don R. Sauer, San Jose, Calif.

[73] Assignee: National Semiconductor Corporation, Santa Clara, Calif.

[21] Appl. No.: 197,294

[22] Filed: Oct. 15, 1980

[51] Int. Cl.³ .............................................. H03D 3/06

[52] U.S. Cl. ............................... 329/103; 179/1 GE; 329/137; 329/139; 455/214

[58] Field of Search ............... 329/103, 110, 137, 139, 329/140, 143; 455/214, 337; 179/1 GC, 1 GD, 1 GE, 1 GS

[56] References Cited

U.S. PATENT DOCUMENTS 4,100,500 7/1978 Ohsawa et al. ..................... 329/103

4,122,394 10/1978 Fukushima et al. ............ 329/103 X 4,232,268 11/1980 Hinn .................................... 329/103

*Primary Examiner*—Siegfried H. Grimm

*Attorney, Agent, or Firm*—Gail W. Woodward; Neil B. Schulte; Paul J. Winters

[57] ABSTRACT

A decoder for obtaining the L-R information in an AM stereo radio receiver. The decoder is basically a four-quadrant multiplier that has one pair of inputs driven from a limiter that operates from the receiver intermediate frequency amplifier. The limiter also drives a tuned circuit which in turn drives the other two multiplier inputs in phase quadrature with the first input pair. The multiplier output is frequency modulation responsive which, when integrated, produces a phase modulation response. The integration is produced by a capacitor connected across the multiplier output terminals. The decoder also includes a large parallel connected inductor that resonates the integrating capacitor at a frequency at the low end of the audio range. This inductor acts as a d-c short at the decoder output and sets the decoder response to the setaudible stereo pilot signal. The inductor is simulated with integrated circuit components. A first transconductance amplifier coupled to the multiplier output, drives a capacitor which in turn drives a second transconductance amplifier that operates current sources which act as load elements for the multiplier. The resultant feedback loop creates an inductive reactance that simulates a large inductor.

7 Claims, 4 Drawing Figures

AM STEREO PHASE MODULATION DECODER

BACKGROUND OF THE INVENTION

The invention relates to AM stereo radio broadcast receivers and is particularly directed to a receiver using the Magnavox system recently announced as the system of choice by the Federal Communications Commission. In this system, the conventional amplitude modulated (AM) radio channel carries the L+R stereo signal so that a conventional monaural radio receives a compatible signal. The L−R stereo signal is transmitted as a phase modulation (PM) of the carrier. A subaudible pilot tone also phase modulates the carrier. Its phase modulation is substantially greater than the L−R component. Since the conventional radio will not respond to the PM, it will not be affected thereby. However, if a limiter and PM detector are added to a conventional radio, the AM will be ignored and the PM can be recovered. Therefore the L−R information and pilot signal can be separately recovered. It is then only necessary to matrix the two channels to recover the stereo signals for reproduction in a stereo audio system.

While the circuits disclosed herein are intended for use with the proposed Magnavox system, it is to be understood that the functions performed can be used with other proposed AM stereo systems.

It is important that the additional stereo receiver circuitry be available in integrated circuit (IC) form to minimize the economic impact of AM stereo on receiver construction. It is also important that the decoder does not produce signal radiation that can be picked up by the radio signal circuits where it can produce spurious responses. It should be as linear as possible, noise free, and as immune to overmodulation and carrier propagation problems as possible.

In most receiver proposals currently available, the PM detection systems employ a synchronous detector and a phase locked loop oscillator (PLLO). Such an arrangement commonly produces substantial radiation and is excessively responsive to overmodulation of the carrier.

SUMMARY OF THE INVENTION

It is an object of the invention to provide an L−R AM stereo decoder that operates as an FM detector followed by an integrator to produce PM response.

It is a further object of the invention to employ a four-quadrant multiplier with a quadrature-producing tuned circuit and a built-in integrator as an AM stereo decoder.

It is a still further object of the invention to tune the audio output of an AM stereo decoder PM detector to control the tuning response and the response of the circuit to the stereo pilot signal.

It is a still further object of the invention to simulate a large inductor for audio tuning to assist in decoding the L−R information and a subaudible AM stereo pilot signal.

These and other objects are achieved in an IC configured as follows. First, the radio IF signal is passed through a limiter stage and applied to two input terminals of a four-quadrant multiplier. The multiplier input is employed to drive a tuned circuit which then provides a quadrature signal to the other two input terminals. The output terminals of the multiplier are coupled to a large capacitor that integrates its response to create a PM output.

A large inductor is electronically simulated across the integrating capacitor for controlling the low-frequency audio response of the decoder. This is done to effectively short the output for dc and to set the circuit response to the subaudible stereo pilot signal at a suitably reduced level. The simulation is achieved by coupling the two multiplier output terminals to a transconductance (Gm) amplifier which has a current drive output coupled to a capacitor. The capacitor voltage lags the applied current by 90 degrees and is coupled to a second Gm amplifier which has a pair of outputs that are used to vary a pair of current sources that act as loads for the multiplier output terminals. This feedback arrangement causes the fedback current to lag the terminal voltage by 90 degrees thus simulating an inductor. The inductor value is determined by the value of the capacitor and the current fed into it from the first Gm amplifier. Using this approach, inductance values of several hundred henries can be simulated so that a relatively small integrating capacitor will resonate at the lower audio frequencies.

The feedback loop that creates the inductor that acts as a d-c short has an additional use. When the multiplier output currents are equal, the capacitor will be charged to an average voltage that will produce zero average differential input voltage at the second Gm amplifier. If the output currents are not equal, as a result of mistuning, the capacitor charge will be varied so that the second Gm amplifier receives a correcting signal that produces the required zero d-c output voltage. Thus, the capacitor charge will vary as a function of tuning in the multiplier. This capacitor voltage can be employed as a tuning indicator and, if desired, as an AFC voltage source in the radio receiver. From the above it can be seen that as long as the detector is in tune, or reasonably close thereto, there will be zero differential d-c output voltage yet the signal components will be present as a differential signal. However, if the range of the feedback circuit is exceeded, a d-c offset will occur.

The differential input to the first Gm amplifier can also be coupled to a current comparator having a deadband that embraces the desired tuning range. This comparator will provide an output signal only when the mistuning is excessive in the receiver.

A symmetrical four-quadrant multiplier is employed so that the current drain on the power supply is constant even though the transistors therein are being switched on and off. This greatly reduces the tendency of the circuit to produce radiation. The associated tuned circuit is driven from a differential current source and furthermore it can be shielded so that the decoder will produce little or no spurious signal radiation. Since synchronous detection is not employed, the circuit is relatively immune to overmodulation of the AM carrier. Such a condition in a synchronous detector system will produce noise bursts due to carrier phase reversals.

DESCRIPTION OF THE INVENTION

Figure 1:
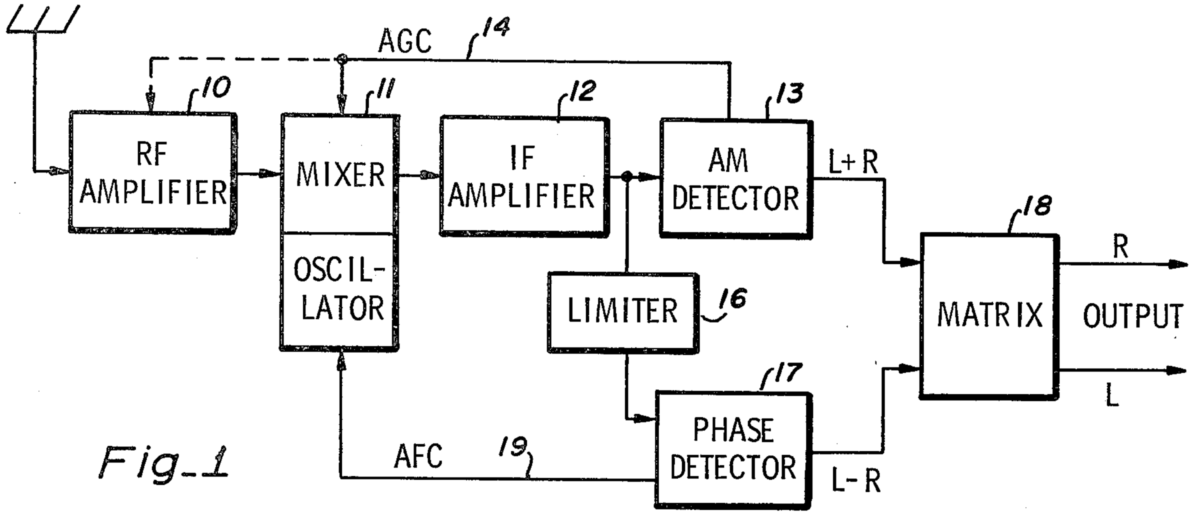
FIG. 1 is a block diagram of an AM stereo receiver.

In FIG. 1, an AM radio is shown in block diagram form with the components added to convert it to a stereo receiver. R-F amplifier 10 (which is optional), converter 11, i-f amplifier 12, and detector 13 are conventional and will produce an L+R output which is the conventional monaural program signal. Typically, such a receiver will employ an AGC line 14 to vary the gain in i-f amplifier 12 and possibly r-f amplifier 10, as shown by the dashed connection, to provide a relatively constant output or L+R signal. These elements are the equivalent of those found in an ordinary radio which will respond compatibly to the stereo broadcast.

For stereo, a limiter 16 feeds an i-f signal to phase detector 17 which responds to the phase modulation of the stereo carrier to produce an L−R output. A matrix circuit 18 combines the L+R and L−R signals to create the L and R audio channel signals which are then reproduced in a conventional stereo audio amplifier and speaker system (not shown).

Since detector 17 responds to signal phase, it can be used as an automatic frequency control (AFC) on line 19 to control the receiver local oscillator.

In most AM stereo receivers, the stereo channel is detected using a synchronous detector operated from a PLLO. In such a system, the oscillator, which is operated at high level produces substantial radiation which can be picked up by the receiver circuits as a spurious i-f signal. Also, such a detector produces large output pulses when the AM carrier is overmodulated due to carelessness at the transmitter or due to multipath reception. These pulses appear as noise.

Figure 2:
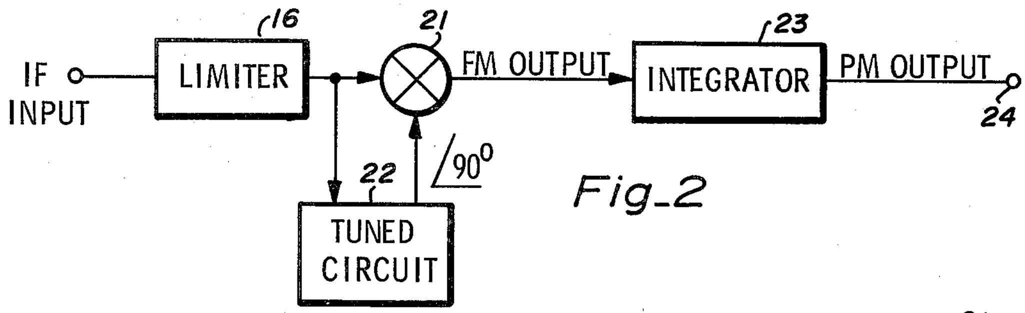
FIG. 2 is a block diagram of a phase detector suitable for an AM stereo radio.

FIG. 2 shows a preferred detector circuit in block diagram form. Limiter 16 is conventional and drives a multiplier 21. The limiter 16 also drives a tuned circuit 22 which is tuned to the i-f signal and provides a sine wave which is in quadrature with the i-f signal and is also fed to multiplier 21. When the limiter output is multiplied by the phase quadrature-tuned circuit signal the result is a d-c output related to the signal frequency so that a frequency modulation (FM) detector is achieved. By integrating the FM signal with integrator 23, the FM signal is converted to a PM signal which appears at terminal 24. Since for AM stereo, the radio transmitter was phase modulated with the L−R stereo information and pilot, the signal at terminal 24 is the L−R audio signal along with the subaudible pilot signal.

Figure 3:
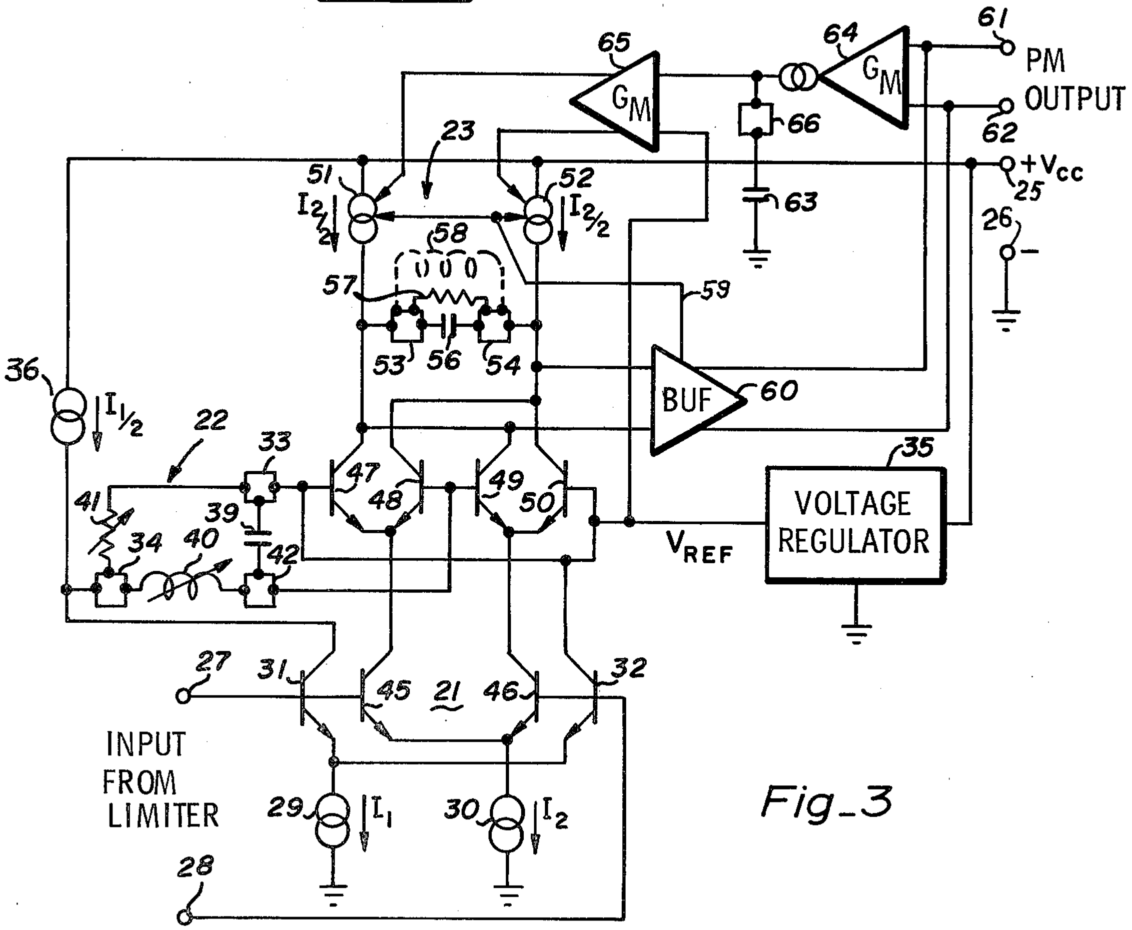
FIG. 3 is a schematic block diagram of a four-quadrant multiplier suitable for use as a phase detector.

The blocks 21, 22, and 23 of FIG. 2 are shown in schematic diagram form in FIG. 3. The circuit operates from a power supply, $V_{CC}$, connected between + terminal 25 and ground terminal 26. For the following discussion it will be assumed that transistor base current can be neglected relative to collector current. Input terminals 27 and 28 represent the output terminals of limiter 16 which provides a differential drive to multiplier 21.

A pair of constant current sinks 29 and 30 pass currents $I_1$ and $I_2$ respectively. Transistors 31 and 32 drive tuned circuit 22. They switch $I_1$ alternately between $V_{REF}$ pad 33 and pad 34. $V_{REF}$ is typically a regulated 4.2 volts achieved using a conventional voltage regulator 35. Current source 36 supplies a constant $I_{\frac{1}{2}}$ to pad 34. This current value actually represents $I_1$ flowing at 50% duty cycle by the action of transistor 31. The other half of $I_1$ is supplied by regulator 35.

Tuned circuit 22 is made up of capacitor 39 inductor 40 and resistor 41 coupled exteriorily to the IC using pads 33, 34 and 42. Capacitor 39 and inductor 40 tune the circuit center frequency to the receiver i-f and resistor 41 is employed to set the tuned circuit Q to provide the desired detector output curve slope. It will be noted that inductor 40 and resistor 41 provides a d-c return so that pads 33, 34 and 42 are all substantially at the d-c potential of $V_{REF}$. Since resistor 41 will control the slope of the detector phase response, it also sets the stereo gain response of the decoder. Thus, after the stereo receiver is manufactured, the value of resistor 41 can be finally adjusted for the desired stereo signal separation.

Current sink 30 passes $I_2$ from transistors 45 and 46 so that $I_2$ alternately flows in transistor pair 47–48 and transistor pair 49–50. Current sources 51 and 52, which are designed to nominally pass $I_{2/2}$, act as output load devices coupled respectively between pads 53 and 54 and the $+V_{CC}$ line. Note that transistors 47 and 49 commonly couple to load 51 while transistors 48 and 50 commonly couple to load 52. Thus, input terminals 27 and 28 constitute a pair of inputs to multiplier 21 via transistors 45 and 46 while transistors 31 and 32 provided differential current drive to tuned circuit 22. The output of tuned circuit 22, which is in quadrature with its drive, provides a second pair of inputs to multiplier 21 at pads 33 and 42. The signal input level is large enough to operate the transistors 45–50 in the switching mode and it can be seen that the total current is constant. This means that whenever the signal drive turns a transistor off another similar transistor is turned on. Thus, the multiplier current drawn between terminals 25 and 26 is constant and the circuit produces no supply transients. Since tuned circuit 22 components 39–41 can be located inside a conductive shield can, the entire circuit produces virtually no signal radiation.

The integration function 23 of FIG. 2 is achieved by connecting capacitor 56 directly between output terminal pads 53 and 54. A resonant circuit is formed with inductor 58 which is shown dashed because it is not an actual inductor, but is simulated as will be detailed hereinafter. Resistor 57 acts to damp the resonant circuit so as to avoid ringing. Typically, the RLC circuit thus formed is tuned to the low audio frequency range of about 30 Hz. Thus, the circuit response at 5 Hz, the stereo pilot frequency, is at a reduced level that can be controlled by the value of inductor 58.

Buffer amplifier 60 couples pads 53 and 54 to audio signal terminals 61 and 62 which will contain the L−R and pilot stereo informaton. Line 59 from buffer 60 forms a negative feedback loop that controls the common mode level of sources 51 and 52. This feedback ensures that the sum of the currents in sources 51 and 52 equals the actual value of $I_2$ in sink 30.

Since inductor 58 must resonate capacitor 56 to a low audio frequency, it must be quite large, on the order of several hundred henries. Such a physical inductor is impractical, but can be simulated, as indicated by the dashed lines, using IC techniques. Basically, the large inductor is simulated by merely adding a capacitor 63 and two differential Gm amplifiers 64 and 65. Capacitor 63 is external to the IC and is coupled by way of pad 66.

Differential amplifier 64 responds to the signals at terminal pads 53 and 54 via buffer 60. Its Gm forces a signal current onto capacitor 63. The voltage across capacitor 63 lags the signal current by 90 degrees. The capacitor voltage drives Gm amplifier 65 which in turn differentially drives current sources 51 and 52. The signal polarities through amplifier 65 and sources 51 and 52 cause the currents fed back to pads 53 and 54 to be phased so that the currents lag the voltage by 90 degrees thereby producing an inductive reactance. The capacitor 63 value along with the amplifier gain is selected to produce the desired value for inductor 58.

The feedback system that simulates inductor 58 will short pads 53 and 54 together for d-c, but will permit differential signal voltages. However, the multiplier will produce differential output currents as a function of mistuning and the feedback system will adjust the currents in sources 51 and 52 to reflect this mistuning. Since the one input of amplifier 65 is returned to $V_{REF}$ pad 33, the voltage at the other terminal, which is bypassed to ground by capacitor 63, will be above or below $V_{REF}$ by an amount determined by the tuning of tuned circuit 22 relative to the i-f signal input. Thus, if the detector is on tune, the voltage at pad 66 will be equal to $V_{REF}$. If the detector is mistuned above the i-f signal frequency, the voltage at pad 66 will be above $V_{REF}$ and if mistuned below the i-f signal frequency the voltage at pad 66 will be below $V_{REF}$. As shown by line 19 of FIG. 1, this voltage can be used for AFC. Also it can be used as a tuning indicator drive.

Figure 4:
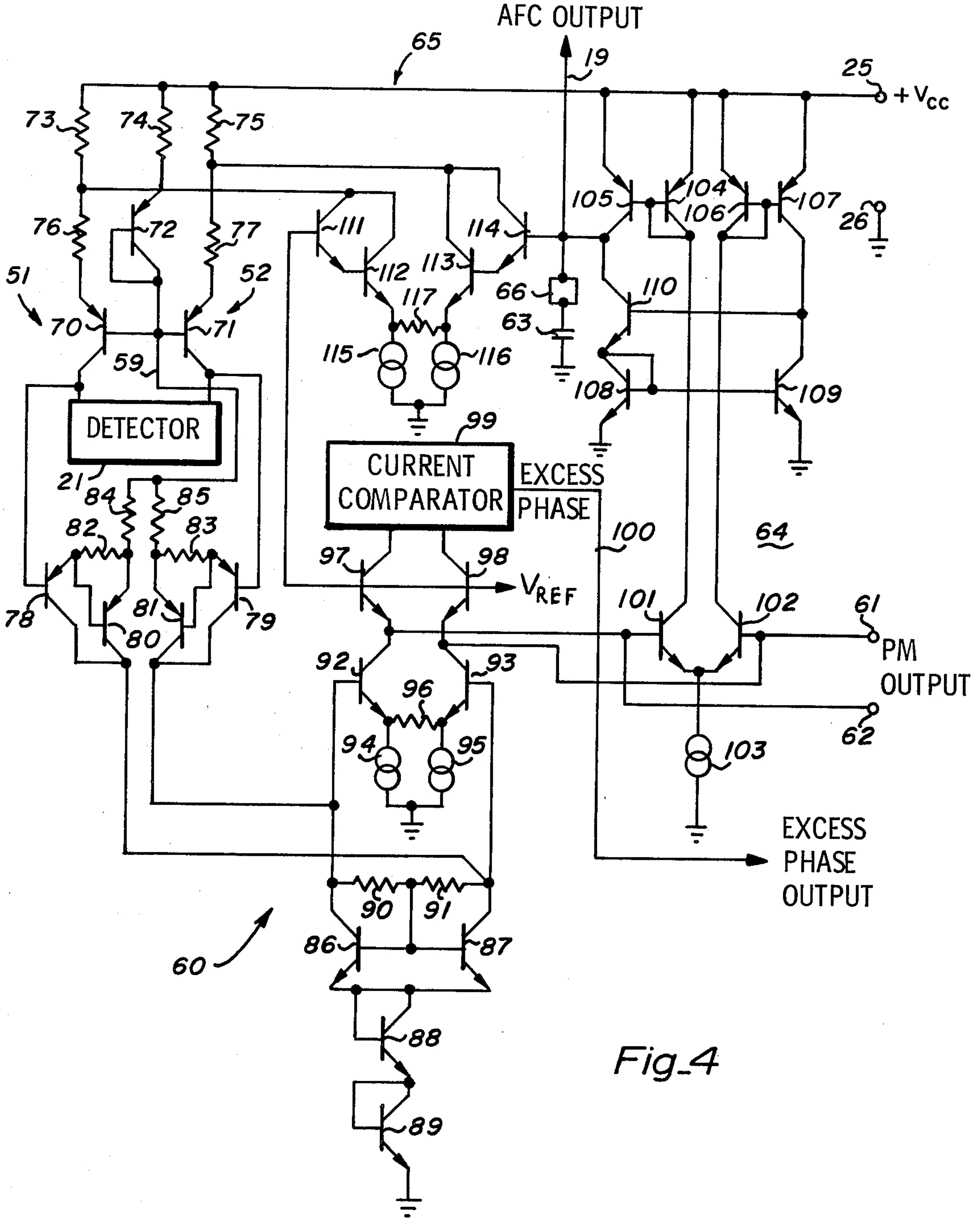
FIG. 4 is a schematic diagram of the AM stereo phase detector showing the details of the amplifier devices shown in block form in FIG. 3.

FIG. 4 is a schematic diagram that details the block elements 60, 64 and 65 of FIG. 3. The PM detector 21 is as was shown in FIG. 3. Current source loads 51 and 52 are shown as transistors 70 and 71 connected to mirror the current flowing in diode connected transistor 72. Resistors 73–77 control the current distribution in the current mirror. Resistors 73 and 75 act as the load elements for differential amplifier 65 which acts to modulate or control the differential currents flowing in sources 51 and 52.

The collectors of transistors 70 and 71, which represent the output terminals of PM detector 21, are directly coupled to the bases of transistors 78 and 79 respectively. Transistors 78 and 79 are Darlington coupled to transistors 80 and 81 respectively. Resistors 84 and 85 act to degenerate the gain of transistors 78–81 and resistors 82 and 83 bias the Darlington connected transistors. It can be seen that transistors 78–81 act as an emitter followers for the common mode output of detector 21 and act to control the base voltage of transistors 70 and 71. This means that current sources 51 and 52 are commonly controlled via line 59 so that the common mode voltage at detector 21 is set so that each load is automatically adjusted to provide its share of the current flowing in detector 21 (identified as $I_2$ in FIG. 2). In effect line 59 completes a common mode high gain negative feedback loop around the detector 21 and loads 51 and 52.

Transistors 86 and 87 act as load elements for the collectors of transistors 80 and 81 respectively. The emitters of transistors 86 and 87 are connected together and to ground through diode connected transistors 88 and 89. Therefore, the commonly connected bases of transistors 86 and 87 operate at $3V_{BE}$ above ground. Due to the presence of resistors 90 and 91, the collectors of transistors 86 and 87 will be at a slightly higher potential to set the level of the bases of directly coupled transistors 92 and 93. Emitter current sinks 94 and 95 along with resistor 96 differentially bias and operate transistors 92 and 93 the outputs of which provide signals to terminals 61 and 62 which represent the buffered PM signal output of the FM detector 21 and integrator 23.

Transistors 97 and 98, which have their bases coupled to $V_{REF}$, act as cascode loads for transistors 92 and 93 and drive a current comparator 99 which is designed to have a deadband as taught in my copending application Ser. No. 187,007 filed Sept. 15, 1980 and titled CURRENT COMPARATOR WITH DEADBAND. If comparator 99 has a deadband control circuit that produces a 9 to 1 deadband ratio, the output on line 100 will turn on when the differential signals exceed a 9 to 1 ratio. The use of this characteristic will be detailed hereinafter.

The collectors of transistors 92 and 93 are directly coupled to the bases of differential transistors 101 and 102 respectively. Current sink 103 is common to the emitters of transistors 101–102. The collectors of transistors 101 and 102 operate a double current mirror turn around circuit to provide a current output for amplifier 64. The two collector currents are reflected first by a current mirror pair made up of transistors 104–107. Then a current mirror load made up of transistors 108–110 provides a single-ended output at pad 66 from the differential signal input at terminals 61 and 62. It can be seen that capacitor 63 loads the output of amplifier 64 which acts as a current source. Thus, in terms of the signal, the voltage at pad 66 will lag the current by about 90 degrees.

The signal voltage at pad 66 is directly coupled to one input of differential amplifier 65, the other input of which is directly coupled to $V_{REF}$. Darlington connected transistors 111 and 112 along with Darlington connected transistors 113 and 114 provide differential high gain signal amplification. Current sinks 115 and 116 along with resistor 117 provide differential bias and signal operation. The collectors of transistors 111 and 112, using resistor 73 as a load, operate source 51. The collectors of transistors 113 and 114 using resistor 75 as a load, operate source 52. Thus, the inversion through amplifier 65 causes the current lag introduced by capacitor 63 to provide a current lead thereby simulating an inductance at detector 21.

As pointed out above simulated inductor 58 provides a d-c short across the output of detector 21 yet permits recovery of the PM information as a differential signal. However, when detector 21 becomes mistuned, the feedback circuit forces loads 51 and 52 to adjust the differential currents to detector 21. When the mistuning exceeds the capability of the feedback circuit to provide corrective action, the circuit will no longer operate and a d-c differential voltage will appear. This differential is sufficient to exceed the deadband of comparator 99 and an indication will appear, on line 100 of this excess phase. The actual range over which the simulated inductor is operative is set by the bias on amplifier 65. As a practical matter the value of resistor 117 can be employed to set the limits of the excess phase response.

While not shown, excess phase line 100 can be coupled to current sink 103. Thus, when the excess phase limits are exceeded the current source coupling amplifier 64 to capacitor 63 can be varied. This can be used to improve the dynamic recovery time of the circuit following a tuning correction to eliminate the excess phase condition.

The circuits of FIGS. 2 and 3 were implemented using conventional IC components. The NPN transistors were of conventional vertical construction and the PNP transistors were of lateral construction. The following component values were employed.

| PART | Example VALUE | UNITS |
|---|---|---|
| Sink 29 | 500 | microamperes |
| Sink 30 | 1 | milliampere |
| Source 36 | 250 | microamperes |
| Capacitor 39 | 600 | picofarads |
| Inductor 40 | 0.65 | millihenry |
| Rheostat 41 | 500 | ohms (maximum) |
| Source 51 | 500 | microamperes |
| Source 52 | 500 | microamperes |
| Capacitor 56 | .047 | microfarad |
| Resistor 57 | 100K | ohms |
| Capacitor 63 | .033 | microfarad |
| Resistor 73 | 500 | ohms |
| Resistor 74 | 500 | ohms |
| Resistor 75 | 500 | ohms |
| Resistor 76 | 500 | ohms |
| Resistor 77 | 500 | ohms |
| Resistor 82 | 30K | ohms |
| Resistor 83 | 30K | ohms |
| Resistor 84 | 1.2K | ohms |
| Resistor 85 | 1.2K | ohms |
| Resistor 90 | 12.5K | ohms |
| Resistor 91 | 12.5K | ohms |
| Sink 94 | 500 | microamperes |
| Sink 95 | 500 | microamperes |
| Resistor 96 | 500 | ohms |
| Sink 103 | 1 | microampere |
| Sink 115 | 125 | microamperes |
| Sink 116 | 125 | microamperes |
| Resistor 117 | 27K | ohms |

The circuit was operated at 260 kHz using an 8 volt $V_{CC}$ supply. Regulator 35 produced a 4.2 volt $V_{REF}$. The simulated inductance value for inductor 58 was 600 henries. The audio bandwidth was 30 Hz to 15 kHz. There was less than 1% distortion of the audio signal when using a 90% modulated L+R carrier. The stereo separation was better than 30 db. The phase detector was operative over a ±2 KHz range. When this range was exceeded, an output appeared on excess phase line 100. Overmodulation and/or multipath reception produced very little noise in the PM signal.

The invention has been described and working example given. When a person skilled in the art reads the foregoing, alternatives and equivalents within the spirit and intent of the invention will occur to him. Therefore, it is intended that the scope of the invention be limited only by the following claims.

I claim:

1. A phase demodulator comprising:

a four quadrant multiplier having first and second input terminal pairs and an output terminal pair;

means for driving said first input pair from a source of phase modulated signal;

means for coupling said phase modulated signal in said multiplier to a tuned circuit resonating at the center frequency of said signal whereby said tuned circuit is caused to oscillate;

means for coupling said tuned circuit to said second input pair to induce a quadrature signal in said multiplier thereby to create a frequency sensitive response;

a capacitor coupled across said output terminal pair for integrating the signal at said output terminal pair thereby to produce a phase responsive output; and first and second variable current sources connected as load elements to said output terminal pair of said multiplier.

2. The demodulator of claim 1 further comprising feedback means operatively coupled in common to control said first and second current sources and responsive to the common mode voltage at the output of said multiplier.

3. The demodulator of claim 1 wherein said demodulator further comprises an inductor coupled in parallel with said capacitor to resonate said output terminal pair at a frequency located at the low end of the audio frequency spectrum.

4. The demodulator of claim 3 wherein the value of said inductor is selected to determine the circuit response to a subaudible frequency carrier modulation signal.

5. The demodulator of claim 3 wherein said inductor is simulated in the form of a circuit comprising:

a first transconductance amplifier having a pair of inputs coupled to said output terminal pair and a current source output;

a capacitor coupled to said current source output whereby the voltage across said capacitor lags said current in phase by approximately 90 degrees;

means coupling the voltage across said capacitor to the input of a second differential transconductance amplifier which has a pair of differential output terminals; and means coupling said pair of differential output terminals of said second transconductance amplifier to separately control said first and second variable current sources whereby the current signals fed back to said multiplier output terminal pair lag the voltage therebetween by approximately 90 degrees to simulate an inductor.

6. The demodulator of claim 5 further comprising a buffer amplifier having a pair of input terminals coupled to said output terminal pair of said four quadrant multiplier and a pair of output terminals coupled to said input terminals of said first transconductance amplifier.

7. The demodulator of claim 6 further comprising current comparator means with deadband coupled to said output terminals of said buffer amplifier whereby said deadband accomodates the normal tuning range of said demodulator and produces an output when said tuning range is exceeded.

* * * * *